United States Patent
Lampe et al.

[11] Patent Number: 5,966,646
[45] Date of Patent: Oct. 12, 1999

[54] DUAL-BAND RADIO RECEIVER

[75] Inventors: Ross W. Lampe, Raleigh; Rodney A. Dolman, Cary, both of N.C.

[73] Assignee: Ericsson, Inc., Research Triangle Park, N.C.

[21] Appl. No.: 08/855,102

[22] Filed: May 13, 1997

[51] Int. Cl.$^6$ .............. H04B 1/26; H04B 17/02
[52] U.S. Cl. .............. 455/189.1; 455/188.1; 455/190.1; 375/347
[58] Field of Search .............. 455/552, 575, 455/553, 180.1, 188.1, 189.1, 190.1, 183.1, 259, 260, 86; 375/347, 267; 380/34, 38

[56] References Cited

U.S. PATENT DOCUMENTS

| | | | |
|---|---|---|---|
| 4,218,773 | 8/1980 | Imamura | 455/159 |
| 4,509,198 | 4/1985 | Nagatomi | 455/4 |
| 4,852,123 | 7/1989 | Bickley et al. | 375/9 |
| 5,027,430 | 6/1991 | Yamauchi et al. | 455/188 |
| 5,355,524 | 10/1994 | Higgins, Jr. | 455/82 |
| 5,361,404 | 1/1994 | Dent . | |
| 5,408,201 | 4/1995 | Uriya . | |
| 5,584,056 | 12/1996 | Kim . | |
| 5,602,847 | 2/1997 | Pagano et al. | 370/484 |
| 5,722,053 | 2/1998 | Kornfeld et al. | 455/86 |
| 5,727,019 | 3/1998 | Tatsumi | 375/222 |
| 5,757,921 | 5/1998 | Okanobu et al. | 380/38 |
| 5,758,266 | 5/1998 | Kornfeld et al. | 455/86 |
| 5,787,126 | 7/1998 | Itoh et al. | 375/340 |
| 5,793,794 | 8/1998 | Kato et al. | 375/200 |
| 5,809,090 | 9/1998 | Buternowsky et al. | 375/347 |
| 5,825,887 | 10/1998 | Lennen | 380/34 |

FOREIGN PATENT DOCUMENTS

| | | |
|---|---|---|
| 0784381A2 | 7/1997 | European Pat. Off. . |
| 0 678 974 A2 | 4/1995 | Finland . |
| 0291508 | 7/1982 | United Kingdom . |

*Primary Examiner*—Edward F. Urban
*Assistant Examiner*—Pablo Tran
*Attorney, Agent, or Firm*—Rhodes, Coats & Bennett, LLP

[57] ABSTRACT

A simplified structure is disclosed for a dual-band, double-conversion superheterodyne receiver. All mixer-injection signals are generated by combining the outputs of two phase-locked frequency synthesizers driven by a single reference oscillator. The output of one synthesizer injects the receiver's second mixer, which converts signals from the first intermediate frequency to the second intermediate frequency. The output of the other synthesizer has two uses: (1) it provides first mixer injection needed to tune the receiver to a primary band, and (2) it is mixed with the output of the first synthesizer to provide the first mixer injection needed to tune the receiver to an alternate band.

34 Claims, 8 Drawing Sheets

DUAL-BAND RADIO RECEIVER

FIELD OF THE INVENTION

This invention relates in general to radio receivers, and more specifically to a simplified structure for dual-band, double-conversion superheterodyne receivers.

BACKGROUND OF THE INVENTION

The structure and operation of the superheterodyne receiver is well-known in the prior art, as described in Communication Systems (A. Bruce Carson, McGraw-Hill Book Company, New York, second edition, 1975, pages 207–211), the disclosure of which is incorporated herein by reference.

As described by Carlson, a superheterodyne receiver comprises a preselector filter, a radio frequency amplifier, a frequency converter, an intermediate frequency filter, an intermediate frequency amplifier, and a detector. The preselector filter passes frequencies in the desired band which are amplified by the amplifier. The filtered and amplified signal passes to the frequency converter which converts the signal to an intermediate frequency. The frequency converter includes a mixer and a local oscillator. The received signal is applied to a first input of the mixer. A locally generated wave produced by the local oscillator is applied to a second input of the mixer. The mixer combines the inputs to generate an intermediate frequency signal. The mixer output, which is a fixed frequency signal, is filtered by the intermediate frequency filter to remove noise and undesired signals and then amplified by the intermediate frequency amplifier before passing to the detector. The detector separates the modulating signal from the carrier wave. This basic radio architecture to is called a superheterodyne receiver.

In superheterodyne receivers, it is desirable to use a low intermediate frequency to make amplification easier and to allow use of high performance filters that suppress adjacent channel interference. However, if a low intermediate frequency is chosen, a problem arises because of image response. If the carrier is below the oscillator frequency ($f_c = f_o - f_{i-f}$), then a frequency separated from the desired carrier frequency by two times the intermediate frequency will produce the same result since the sign of the difference is not significant. This frequency, known as the image frequency ($f_s$), will produce a spurious response at the receiver. This unwanted image response must be suppressed in the preselector filter. Suppression of the image response is easier the larger the value of the intermediate frequency. Thus, in single heterodyne receivers, a compromise value is chosen for the intermediate frequency.

More complex designs known as double-conversion superheterodyne receivers are taught in the prior art to resolve the conflict between adjacent channel suppression and RF image rejection that is inherent in the single conversion heterodyne receiver. In a double-conversion receiver, two mixers are used which translate the received signal to two different intermediate frequencies. The received signal is translated by a first mixer to the receiver's first intermediate frequency. The output of the first mixer is then filtered to suppress the image frequency and amplified before it is passed to the second mixer. Signals output by the first intermediate frequency amplifier are translated to a second intermediate frequency by means of a second mixer. At the second intermediate frequency, signals are filtered to further suppress adjacent channel interference, further amplified, and then passed to the detector.

With this arrangement, the first local oscillator must have the tuning range and degree of tuning resolution needed to accommodate the channel structure of the signals to be received. Moreover, the stability and spectral purity of the first local oscillator are important factors in determining the receiver's performance. In practice, however, the spectral purity and the stability of a tunable local oscillator degenerate as its tuning range increases and its resolution becomes finer.

In response to this unfavorable tradeoff, prior art receiver design has evolved according to two approaches. In the first approach, the tuning range of the first local oscillator—and therefore the tuning range of the receiver—are limited to a relatively narrow band of frequencies over which stability and spectral purity can be ensured consistent with a given fineness of tuning resolution. To extend the tuning range, prior art teaches the use of a plurality of separate mixer-oscillator pairs, one pair for each frequency band of interest. In the second approach, the amount and complexity of the circuitry is increased thereby increasing the cost of the receiver.

SUMMARY AND OBJECTS OF THE INVENTION

In light of the foregoing known problems and limitations of prior art receivers, it is an object of the present invention to improve the performance of the double-conversion superheterodyne receiver over a wide range of operating frequencies while maintaining simplicity of design. It is a further object of the present invention to simplify the design of the double-conversion superheterodyne while maintaining a desired level of performance.

These objects are achieved in a simplified structure for a double-conversion superheterodyne radio receiver that operates over two bands of frequencies—a primary band and an alternate band. In a preferred embodiment, the receiver has separate preselector filters and separate first mixers for each frequency band. The mixer outputs for each band are connected to the input of a common first intermediate frequency stage. The output of the first intermediate frequency stage is converted to a second intermediate frequency by a second mixer. A single oscillator serves as a reference for two phase-locked frequency synthesizers. The output of one synthesizer injects the first mixer for the primary band. The output of the other synthesizer injects the second mixer, which converts signals from the first intermediate frequency to the second intermediate frequency. To provide injection for the first mixer for the alternate band, the outputs of the two synthesizers are mixed by an injection mixer.

DESCRIPTION OF THE PRIOR ART

Figure 1:
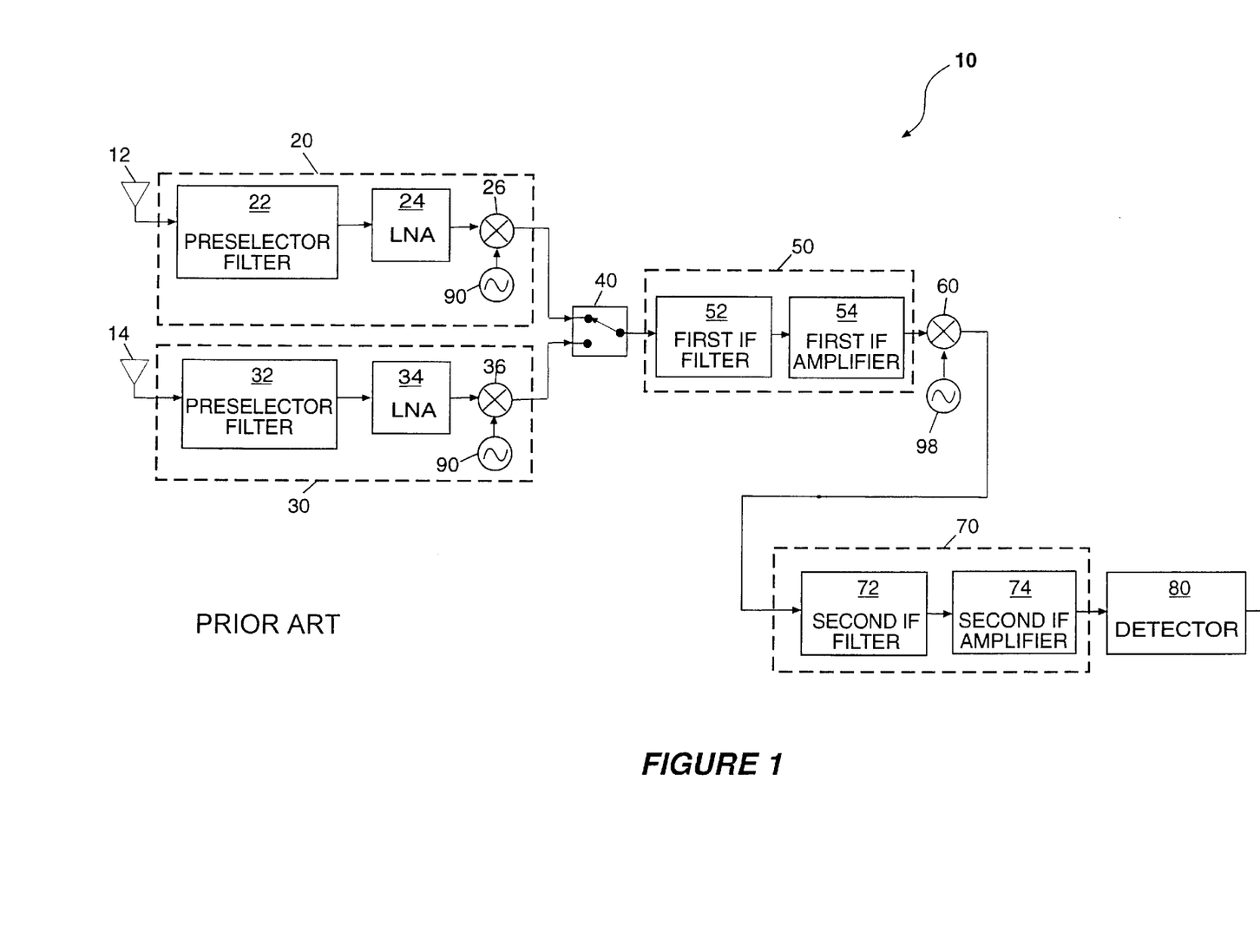
FIG. 1 is a block diagram of a dual-band, double-conversion superheterodyne receiver as taught by the prior art.

Referring now to the drawings, and particularly to FIG. 1, a block diagram of a conventional dual-band, double-conversion receiver indicated generally by the number 10 is shown. Signals from a primary band are picked up by an antenna 12 which is connected to the input of front end 20. In a similar manner, signals for an alternate band are picked up an antenna 14 which is connected to the input of front end 30. Front end 20 includes a preselector filter 22, low-noise amplifier 24, and mixer 26. The preselector filter 22 suppresses signals outside the primary band. The low-noise amplifier 24 increases the strength of the received signals passed by the filter 22. The mixer 26 converts the received signals in the primary band to a first intermediate frequency. The injection signal for the mixer 26 is provided by a first frequency synthesizer 90 which serves as a local oscillator for the primary band.

The front end 30 includes a preselector filter 32, a low-noise amplifier 34, and a mixer 36. The preselector filter 32 suppresses signals outside of the alternate band. The low-noise amplifier increases the strength of the received signals passed by the filter 32. The mixer 36 converts the received signals in the alternate band to the first intermediate frequency. The injection signal for the mixer 36 is provided by a second frequency synthesizer 90 which serves as a local oscillator for the alternate band.

The output of front ends 20 and 30 are connected to the input of a first intermediate frequency stage 50 by means of a switch 40. The first intermediate frequency stage 50 comprises a first intermediate frequency filter 52 followed by a first intermediate frequency amplifier 54. The purpose of the first intermediate frequency filter 52 is to reject the image frequency with respect to the second intermediate frequency and to provide some degree of adjacent channel suppression.

The output of the intermediate frequency stage 50 is connected to the signal input port of a second mixer 60. The purpose of the second mixer 60 is to convert the received signal to a second intermediate frequency. The injection signal for the second mixer 60 is provided by a local oscillator 98.

The output of the second mixer 60 is connected to the input of a second intermediate frequency stage 70 which comprises a second intermediate frequency filter 72 followed by a second intermediate frequency amplifier 74. The purpose of the second intermediate frequency filter 72 is to provide further adjacent channel suppression. The output of the second intermediate frequency stage 70 is connected to a detector 80 whose design is chosen according to the modulation scheme employed. For example, a receiver for FM signals would use a limiter followed by a discriminator as its detector, whereas a receiver for single sideband suppressed carrier signals would use a product detector of a synchronous detector.

Figure 2:
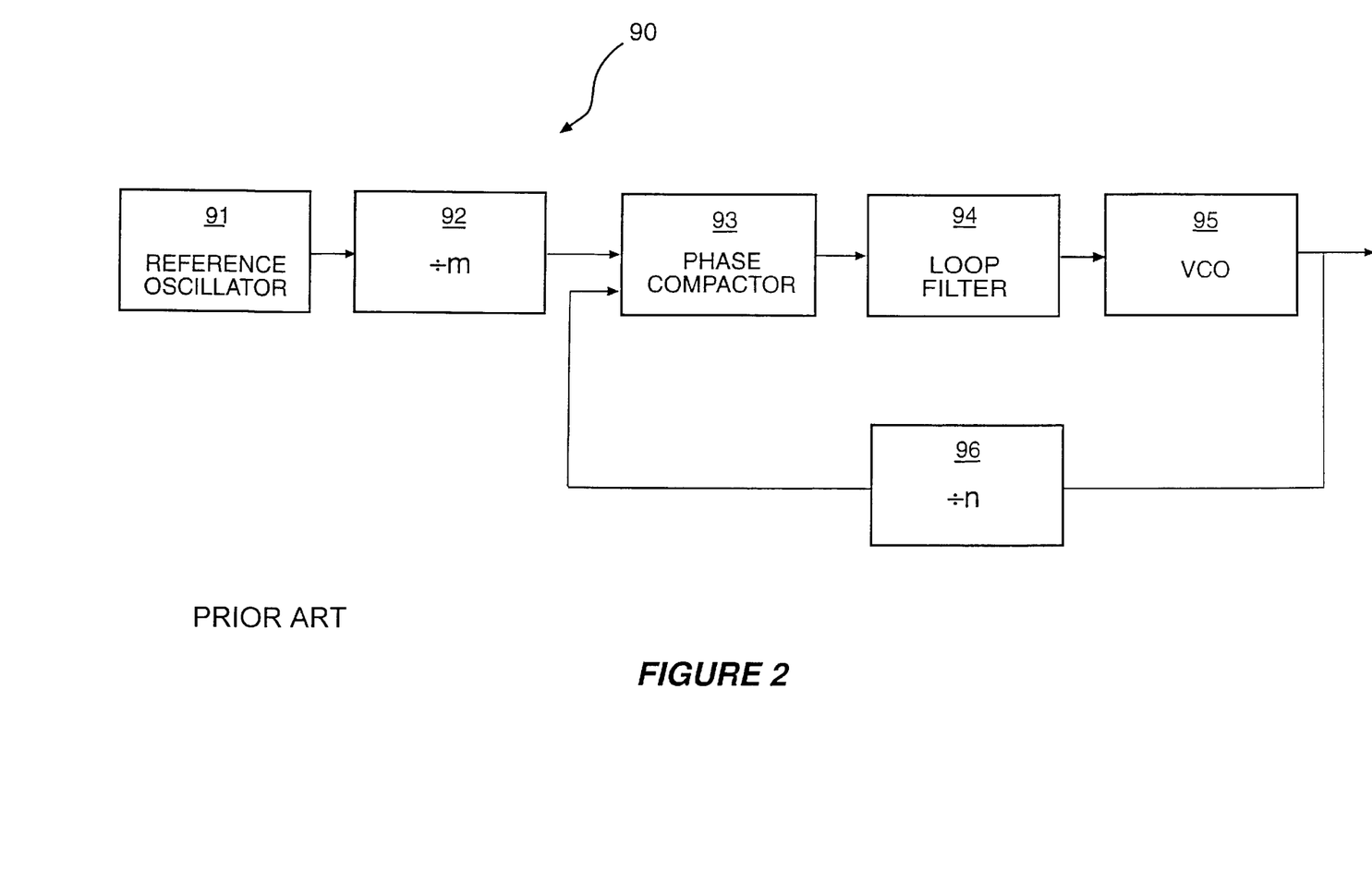
FIG. 2 is a block diagram of a phase-locked frequency synthesizer as taught by the prior art.

FIG. 2 shows the structure of frequency synthesizer 90 which provides an injection signal for a first mixer 26. In synthesizer 90, the output of a reference oscillator 91 is connected to the input of a divide-by-m circuit 92. The divide-by-m circuit 92 converts the reference frequency to a lower frequency. The value of the reference frequency and m ($f_r/m$) is selected to give the correct channel spacing. For example, with a 5 MHz crystal, if m=200, the channel spacing will be 25 kHz. The output of circuit 92 is connected to one input of a two-input phase comparator 93. The other input of the phase comparator 93 is provided by a voltage controlled oscillator 95. The output of oscillator 95 is connected to the input of a divide-by-n circuit 96 whose output is connected to the input of comparator 93. The value of n is selected to correspond to the channel required. The output comparator 93 is connected to the input of a loop filter 94 which is connected to the input of the voltage controlled oscillator 95. The output of oscillator 95 serves as the output of synthesizer 90 which is applied to the first mixer 26. The structure of the frequency synthesizer 90 for the alternate band is the same, however, the values of the reference frequency, m and n, will typically differ for the alternate band.

Figure 3:
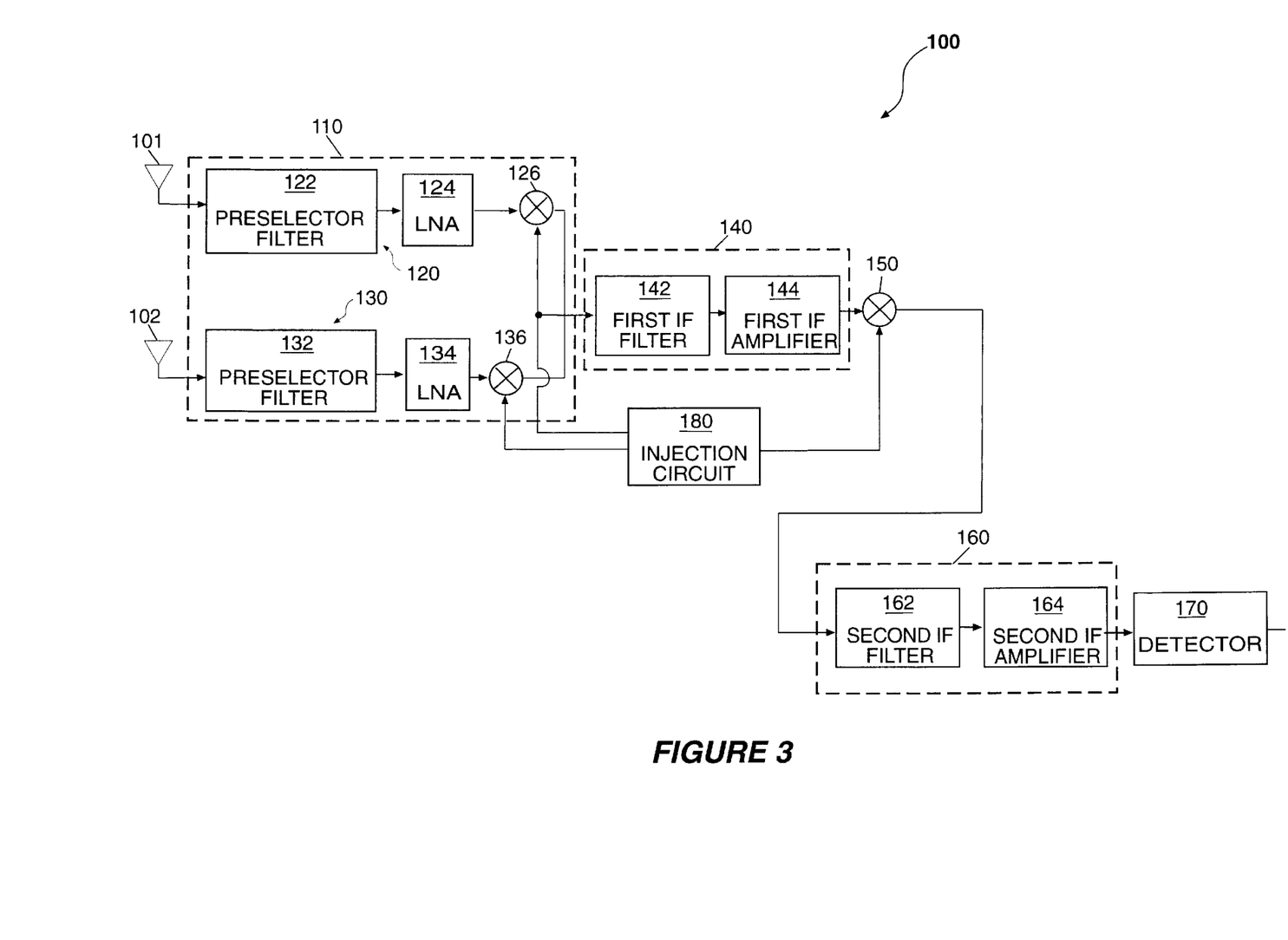
FIG. 3 is a block diagram of a dual-band, double-conversion receiver according to the present invention.

Dual-band receivers 10 as taught by the prior art employ a significant amount of circuitry which can be substantially reduced by designing circuits that can be shared by both frequency bands. FIG. 3 shows a block diagram of a dual-band, double-conversion superheterodyne receiver 100 with a simplified structure according to the present invention. Antenna 101, which receives RF signals from the primary band, and antenna 102, which receives signals from the alternate band are connected to a dual-band front end 110 having first and second signal paths 120 and 130, respectively. For example, a dual-band receiver as described herein may be used for cellular band and pager band communications. The cellular band comprises frequencies in the range of 869–894 MHz. The pager band comprises frequencies in the range of 929–930 MHz.

The first signal path 120 includes a preselector filter 122, a low-noise amplifier 124, and a first mixer 126. The antenna 101 is connected to the input of the preselector filter 122 which suppresses signals outside the primary band. If the primary band is the cellular band, then the preselector filter would pass frequencies from 869–894 MHz. Filter 122 is typically a ceramic duplexing filter. The output of filter 122 is connected to the low-noise amplifier 124 which increases the signal strength before applying the signal to the first mixer 126 for the primary band. Mixer 126 converts the received primary band signal to a fixed frequency known as the first intermediate frequency.

The second signal path includes a preselector filter 132, a low-noise amplifier 134, and a first mixer 136. If the alternate band is the pager band, then the preselector filter 132 would pass frequencies from 929–930 MHz. Antenna 102 is connected to the input of the preselector filter 132 which suppresses signals outside the alternate band. Filter 132 is typically a 2-pole ceramic filter. The output of filter 132 is connected to the low-noise amplifier 134 which increases the signal strength. The output of the amplifier 134 is connected to the signal input port of first mixer 136 for the alternate band. Mixer 136 converts the received alternate band signal to the same first intermediate frequency used by the primary band The output of front end 110 which is provided by either one of the mixers 126, 136 is connected to the input of first intermediate frequency stage 140. The first intermediate frequency stage 140 includes a first intermediate frequency filter 142 and first intermediate frequency amplifier 144. The purpose of the first intermediate frequency filter is to reject the image frequency of the second intermediate frequency. Typically, this is either a crystal or surface acoustic wave (SAW) filter.

The first intermediate frequency stage output is connected to the signal input port of a second mixer 150. The second mixer 150 mixes the first intermediate frequency signal with a second injection signal to convert it to the second intermediate frequency. The output of second mixer 150 is connected to the input of second intermediate frequency stage 160.

The second intermediate frequency stage 160 includes a second intermediate frequency filter 162 which provides further adjacent channel suppression and a second intermediate frequency amplifier 164. In a preferred embodiment of the invention, two second intermediate frequency filters are used—one for the primary band and one for the alternate band. The filters 162 could both be active filters comprised of transistor circuits, or they could be separate ceramic filters.

The output of the second intermediate frequency stage 160 is connected to detector 170, which has structure chosen according to the modulation scheme employed by the received signal.

Figure 4:
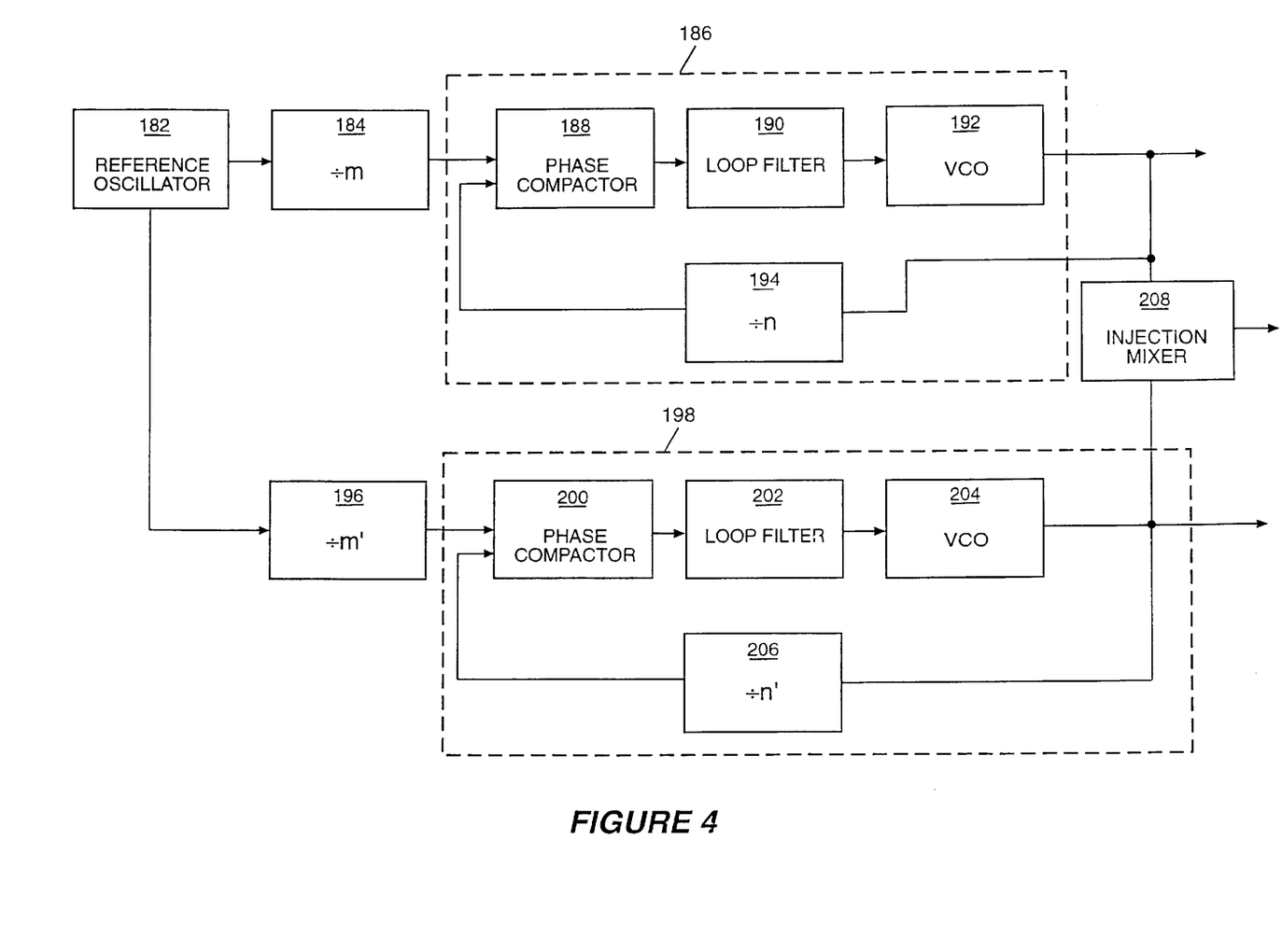
FIG. 4 is a block diagram of the mixer-injection circuit for the dual-band, double-conversion receiver.

Mixer injection signals for mixers 126,136 and 150 are provided by an injection circuit 180 (FIG. 4). Within circuit 180, the output of a reference oscillator 182 is connected to the input of a divide-by-m circuit 184, the output of which is connected to the reference input of a phase-locked frequency synthesizer 186. The synthesizer 186 comprises a phase comparator 188, a loop filter 190, a voltage controlled oscillator 192, and a divide-by-n circuit 194. The output of synthesizer 186 is connected to the injection port of mixer 126 (FIG. 3), and thereby serves as a tunable first local oscillator for the primary band. The output frequency of oscillator 192 is tuned by changing the value of n in circuit 194.

The output of reference oscillator 182 is further connected to a divide-by-m circuit 196, the output of which is connected to the reference input of a phase locked frequency synthesizer 198. Synthesizer 198 comprises a phase comparator 200, a loop filter 202, a voltage controlled oscillator 204, and a divide-by-n-circuit 206. The output of synthesizer 198 is connected to the injection port of a second mixer 150 (FIG. 3), and thereby serves as the receiver's second local oscillator.

The output of synthesizers 186,198 are input to an injection mixer 208 which mixes the signals to produce a third injection signal. The output of injection mixer 208 is connected to the first mixer 136 (FIG. 3), and thereby serves as the first local oscillator for the alternate band.

In the preferred embodiment, preselector filter 122 passes signals between 868–894 MHz without substantial attenuation. Synthesizer 186 operates over the range 914–939 MHz. First intermediate frequency stage 140 has a center frequency of 45 MHz, and second intermediate frequency stage 160 has a center frequency of 12 kHz. Reference oscillator 182 operates at 13.200 MHz. The value of m is set at 440 in order to provide tuning resolution in steps of 30 kHz. The value of n is selected according to $$n=(f+45)/0.03$$

where f is the received frequency in megahertz. For example, to receive a signal whose channel is centered on 869.040 MHz the value of n would be set at 30,468. In this case, the output of synthesizer 186 would be 914.040 MHz, and the output of mixer 122 would be centered at 45 MHz. The frequency of synthesizer 198 is fixed at 44.880 MHz by setting the values m'=5 and n'=17. Injecting mixer 150 at the frequency 44.880 MHz translates the first intermediate frequency at 45 MHz to the second intermediate frequency at 120 kHz.

In the alternate band, preselector filter 132 passes signals between 929–930 MHz without substantial attenuation. Synthesizer 198 operates over the range 929.880—929.880 MHz. Mixer 208, injected by synthesizer 198 at 44.880 MHz, translates the output of synthesizer 186 to the range 884–885 MHz, which is the local oscillator frequency needed to translate an incoming signal at 929–930 MHz to the 45 MHz center frequency of first intermediate frequency 140. Again, second intermediate frequency stage 160 has a center frequency of 120 kHz, and reference oscillator 182 operates at 13.200 MHz. The value of m is set to 528 in order to provide tuning resolution in steps of 25 kHz. To receive a signal in the alternate band, the value of n is selected according to $$n=(f-0.120)/0.025$$

where f is the received frequency in megahertz. For example, to receive a channel centered on 929.020 MHz, the value of n would be set at 37,156. In this case, the output of synthesizer 186 would be 928.900 MHz, and the output of mixer 208 would be 884.020 MHz. Injecting mixer 136 at 884.020 MHz would translate the signal received at 929.020 MHz to the first intermediate frequency at 45 MHz.

Where the primary band is a cellular band, and the alternate band is a pager band, the frequency of the reference oscillator should be an integer multiple of 150 kHz. This condition permits the synthesizers 186,198 to be stepped in either 25 or 30 kHz increments, since 150 kHz is divisible by both. This is necessary since cellular channels are spaced 30 kHz apart while pager channels employ 25 kHz channels. By satisfying this condition, common synthesizers can be used for the first and second local oscillators for cellular and pager signals.

Assuming that the frequency of the reference oscillator is evenly divisible by 150 kHz, further simplification of the radio architecture can be obtained if the frequency of the second local oscillator is evenly divisible by the reference frequency. If these two conditions are satisfied, the reference of the first synthesizer 186 could be the second synthesizer 198 instead of the reference oscillator 182. This feature adds flexibility in the frequency planning of the radio and permits the use of reference oscillators that could not otherwise be used. For instance, it would be desirable to use a 14.95 MHz reference oscillator since 3×14.95=45.85 MHz, a convenient frequency for the second injection signal. However, 14.95 MHz is not divisible by 150, whereas 44.85 MHz is.

Additionally, if these two conditions are satisfied, the second frequency synthesizer 196 could be harmonically generated from the reference oscillator in a relatively simple manner instead of being synthesized by more complex synthesizer circuits. By harmonically generated, it is meant that the reference oscillator 182 is multiplied by an integer.

Figure 5:
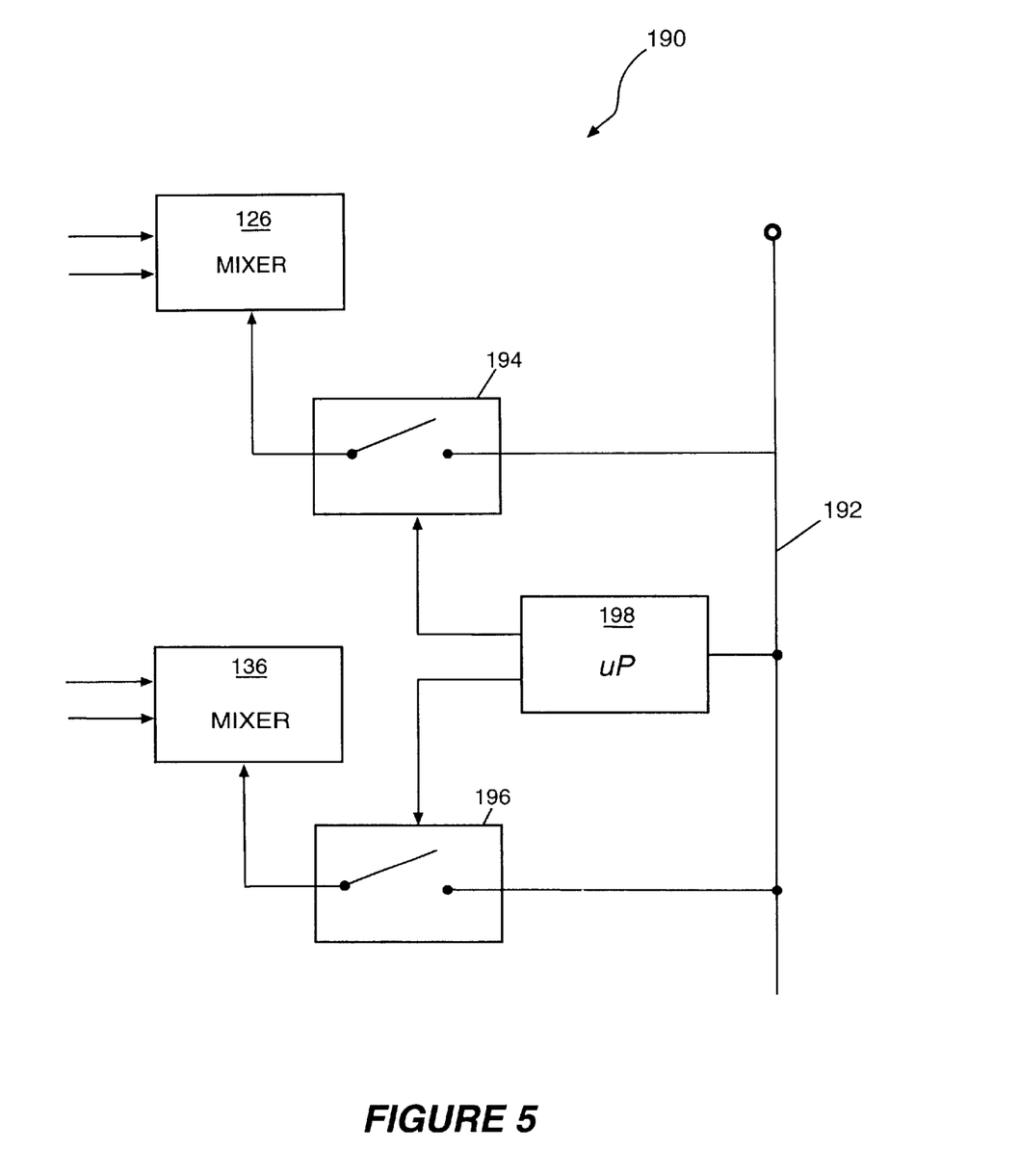
FIG. 5 is a block diagram of the power control circuit for the receiver.

In a preferred embodiment of the present invention, electrical power to mixer 126 and mixer 136 is switched so that one mixer or the other is active, but not both, at any particular instant, thereby selecting either the primary band or the alternate band for reception. FIG. 5 is a schematic diagram of the power control circuit 190 to control power to mixers 126 and 136. Mixers 126 and 136 are connected to a power rail 192 by switches 194 and 196. Although shown as mechanical switches, switches 194 and 196 would preferably be biased junctions, pin diodes, or other electronic switching devices. The switches 194 and 196 are controlled by a logic device 198 which biases the switches 194 and 196. The logic device, which may be a microprocessor, actuates only a single switch 194, 196 at a time. When the mixer 126 is powered down, it provides sufficient isolation from signal path 130 as to have no effect on its operation. Conversely, when mixer 136 is powered down, it provides isolation from signal path 120 as to have no effect on its operation. Alternatively, switches 192 and 194 could be disposed in the signal paths 120, 130 behind the mixers 126, 136.

In another embodiment of the invention, the passband of intermediate frequency stage 70 is altered to accommodate the bandwidth of the received signals by altering the passband of the second intermediate frequency filter within intermediate frequency stage 70. In a further variation of this embodiment, one kind of second intermediate frequency filter 72 is used when the receiver is configured to receive signals in the primary band, and another kind of second intermediate frequency filter 72 is used when the receiver is configured to receive signals in the alternate band. This embodiment of the receiver back-end is shown in FIG. 6.

Figure 6:
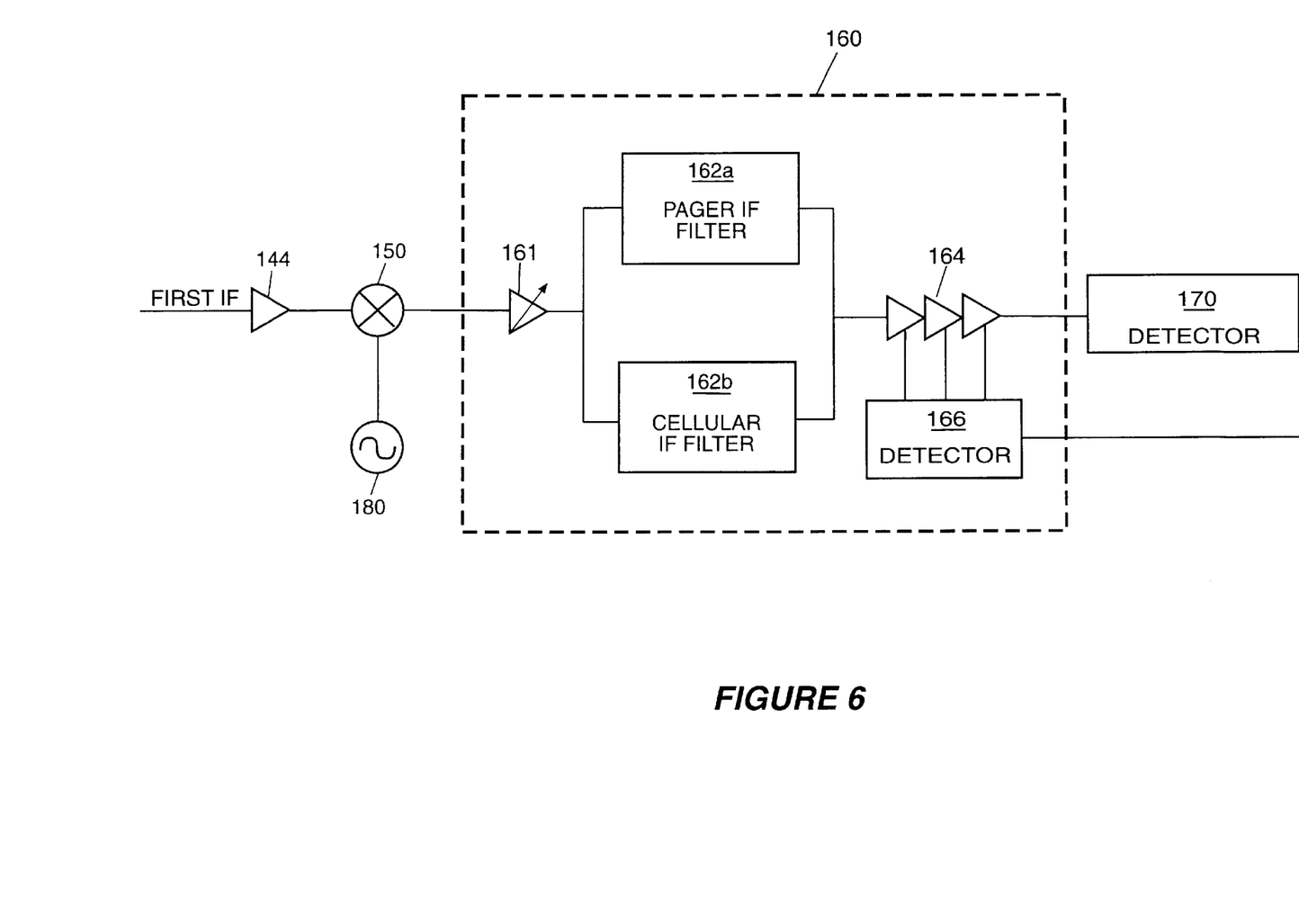
FIG. 6 is a block diagram of an alternate embodiment of the dual-band receiver back-end.

The receiver back-end 70 shown in FIG. 6 includes a variable gain amplifier 144, pre-selector filters 162a and 72b, limiting amplifier 164 and RSSI circuit 166. The essential feature of this embodiment of the receiver back-end is that separate filters are used for the two separate bands. The filters could both be integrated active filters comprised of transistor circuits or they could be separate ceramic filters.

In a preferred embodiment, filter 72b is a passive ceramic filter having a bandwidth of 30 kHz. This filter is used when receiving signals in the primary band. Filter 162a is an active transistorized filter having a bandwidth of 25 kHz. This filter is used when receiving signals in the alternate band.

The IF signal from the first IF stage 50 is amplified and mixed down to the second intermediate frequency by the mixer 150. Mixer 150 is preferably an image suppression mixer. The combination of the first IF filter 144 and image suppression mixer 150 provides adequate image rejection so that a low second IF can be used which in turn allows use of active filters in the second intermediate frequency stage 160. The limiting amplifier 164 hardlimits the second IF before it is passed to the detector, discriminator or demodulator. A logarithmic detector 166 outputs an indication of the received signal strength (RSSI). A receiver IF system with active filters is described more fully in U.S. Pat. No. 5,852,772 filed on Feb. 25, 1997 titled "Receiver IF System with Active Filters" which is incorporated herein by reference.

Figure 7:
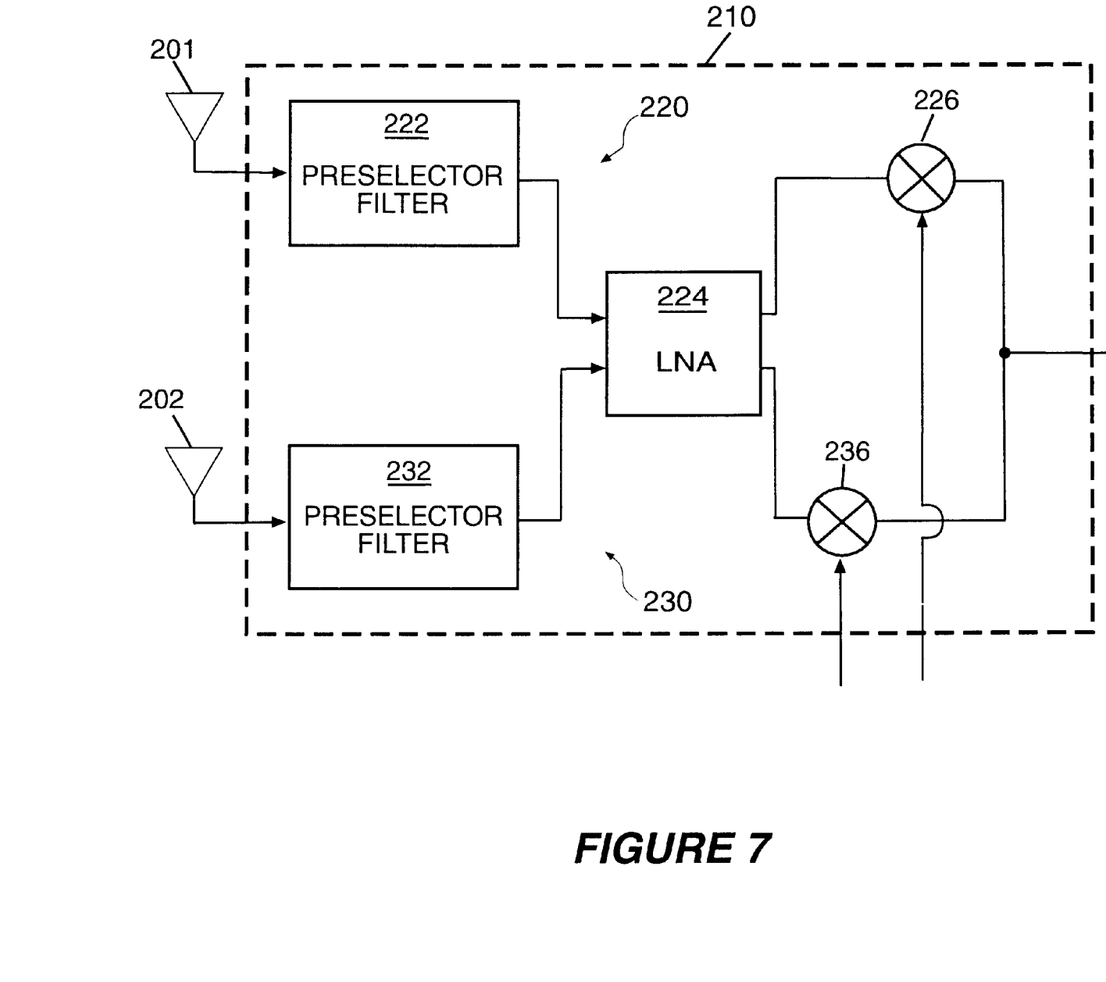
FIG. 7 is a block diagram of an alternate embodiment for the dual-band receiver front-end.

FIG. 7 shows an alternative architecture for the receiver front-end which is indicated by the numeral 210. The front-end 210 makes use of a single wideband low-noise amplifier (LNA) 224. The input of a single LNA is connected to the outputs of preselector filters 222, 232. The output of LNA 224 is connected to the signal-input ports of mixers 226, 236. Thus, the signal paths 220 and 230 share a common LNA 224. In a variation of this embodiment, mixers 226, 236 could be subsumed into a single wideband mixer.

Figure 8:
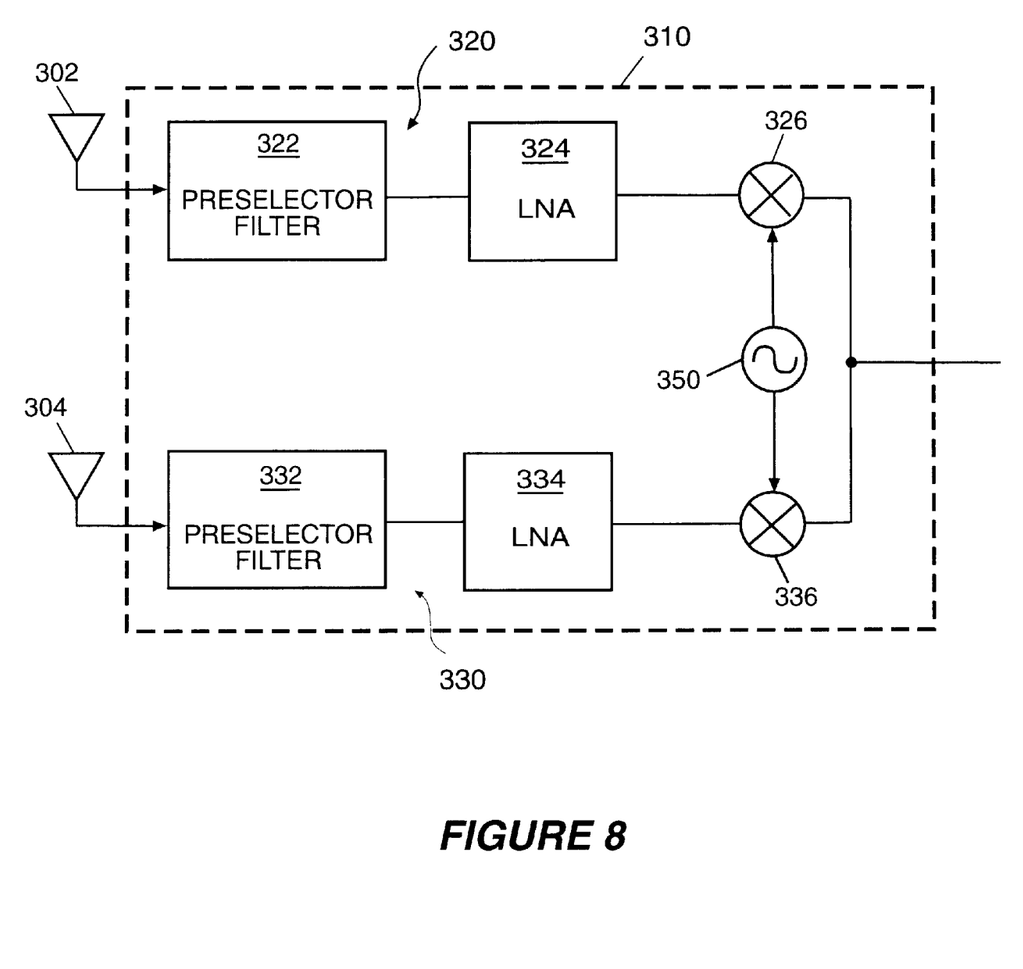
FIG. 8 is a block diagram of another alternate embodiment for the dual-band receiver front-end.

FIG. 8 shows another alternative architecture for the receiver front-end which is indicated by the numeral 310. This embodiment of the receiver front-end 310 includes separate signal paths 320 and 330. Signal path 320 includes a pre-selector filter 322, LNA 324, and mixer 326 to generate a first intermediate frequency signal. Signal path 330 includes preselector filter 332, LNA 334, and mixer 336. A single, wide-band local oscillator should preferably have dual resonators for 884–885 MHz and 914–934 MHz operation or must time across the entire 884–939 MHz band (approximately a 6% fractional bandwidth). In either case, there would be some loss in phase noise performance of the local oscillator 350 due to the addition of circuiting to switch resonator circuits, or by increasing sensitivity of the local oscillator 350.

From the foregoing, it is apparent that the present invention provides a simplified dual-band receiver. Simplification of the receiver is accomplished by sharing the same first and second intermediate frequencies which allow the same components to be used for both bands, by using the same reference oscillator to generate injection signals for the first mixer 126 and the second mixer 150, and by combining the first and second injection signals to produce a third injection signal for the first mixer 136 for the alternate band. Further simplification can be realized by replacing the second local oscillator with a simple multiplier of the reference oscillator. The simplifications may lead to reduced component count, a high level of circuit integration, and significant cost savings.

This disclosure has described what is considered to be a preferred embodiment of the invention, along with several variations. Other variations and modifications of these embodiments will occur to those skilled in the art once they become aware of the basic concepts of the invention, which can be implemented in whole or in part by conventional electronic circuit elements or by means of a programmable digital signal processor. Therefore, what is contained in the claims below is by way of description and not by way of limitation.

What is claimed is:

1. A dual-band superheterodyne receiver comprising:
   a) a front end including first and second signal paths connected to a common output point for receiving radio frequency signals in first and second radio frequency bands respectively;
   b) a first frequency synthesizer for generating a first injection signal;
   c) a second frequency synthesizer for generating a second injection signal;
   d) an injection signal mixer for combining said first and second injection signals to produce a third injection signal;
   e) a first mixer in said first signal path for combining the received radio frequency signal on said first signal path with said first injection signal to produce a first intermediate frequency signal;
   f) a first mixer in said second signal path for combining the received radio frequency signal on said second signal path with said third injection signal to produce a first intermediate frequency signal; and
   g) a back end including a second mixer for mixing said first intermediate frequency signal with said second injection signal to produce a second intermediate frequency signal.

2. The dual-band receiver of claim 1 wherein said first radio frequency band is a cellular band and said second radio frequency band is a pager band.

3. The dual-band receiver of claim 1 further including first and second preselector filters disposed along said first and second signal paths, respectively, for filtering the received signal prior to mixing.

4. The dual-band receiver of claim 3 further including first and second low-noise amplifiers disposed along said first and second signal paths, respectively, between said preselector filters and said first mixers for amplifying said received radio frequency signal.

5. The dual-band receiver of claim 3 further including a common low-noise amplifier connected to both said first and second signal paths between said preselector filters and said first mixers for amplifying said received radio frequency signal.

6. The dual-band receiver of claim 1 further including a first intermediate frequency filter connected to the output of said front end for filtering said first intermediate frequency signal.

7. The dual-band receiver of claim 1 further including two second intermediate frequency filters for filtering said second intermediate frequency signal, wherein a first one of said second intermediate frequency filters is used to filter radio frequency signals received in said first radio frequency band, and wherein the second one of said second intermediate frequency filters is used to filter radio frequency signals received in said second radio frequency band.

8. The dual-band receiver of claim 7 wherein at least one of said second intermediate frequency filters is an active filter.

9. The dual-band receiver of claim 7 wherein at least one of said second intermediate frequency filters is a ceramic filter.

10. The dual-band receiver of claim 1 further including a common frequency reference for said first and second frequency synthesizers.

11. The dual-band receiver of claim 10 wherein said frequency reference is an integer multiple of 150 kHz.

12. The dual-band receiver of claim 1 further including means for selectively powering said first and second signal paths in said front end so that only one signal path is active at a time.

13. A method for converting received radio frequency signals to first and second frequencies comprising the steps of:
   a) generating a first injection signal;
   b) generating a second injection signal;
   c) generating a third injection signal as a function of said first and second injection signals;
   d) receiving a radio frequency signal in a primary frequency band along a first signal path;
   e) mixing received radio frequency signals in said primary frequency band with said first injection signal to produce a first intermediate frequency signal;
   f) receiving a radio frequency signal in an alternate frequency band along a second signal path;
   g) mixing received radio frequency signals in said alternate frequency band with said third injection signal to generate a first intermediate frequency signal; and
   h) mixing said first intermediate frequency signal with said second injection signal to generate a second intermediate frequency signal.

14. The method for converting received radio frequency signals of claim 13 further including the step of filtering said received radio signals in said primary frequency band prior to mixing at a first preselector filter disposed along said first signal path, and filtering said radio signals in said alternate frequency band prior to mixing at a second preselector filter disposed in said second signal path.

15. The method for converting received radio frequency signals of claim 14 further including the step of amplifying the received radio frequency signals in both said primary and alternate frequency bands prior to mixing by means of a single-wide band RF amplifier.

16. The method for converting received radio frequency signals of claim 13 wherein the first and second injection signals are generated from a common reference oscillator.

17. The method for converting receiving radio frequency signals according to claim 16 wherein the frequency of the reference oscillator is an integer multiple of 150 kHz.

18. The method for converting received radio frequency signals according to claim 17 wherein the frequency of the second injection signal is evenly divisible by the frequency reference produced by the reference oscillator.

19. The method for converting received radio frequency signals according to claim 18 wherein the second injection signal is harmonically generated from the reference oscillator.

20. The method for converting received radio frequency signals according to claim 13 further including the step of filtering said second intermediate frequency signal, wherein primary band signals are filtered using a first filter and alternate band signals are filtered using a second filter.

21. The method for converting received radio frequency signals according to claim 20 wherein at least one of said second intermediate frequency filters is an active filter.

22. The method for converting received radio frequency signals according to claim 20 wherein at least one of said second intermediate frequency filters is a passive filter.

23. A dual-band superheterodyne receiver comprising:
   a) a front end including first and second signal paths connected to a common output point for receiving radio frequency signals in distinct first and second radio frequency bands respectively;
   b) a first frequency synthesizer for generating a first injection signal;
   c) a second frequency synthesizer for generating a second injection signal;
   d) a first mixer in said first signal path for combining the received radio frequency signal on said first signal path with said first injection signal to produce a first intermediate frequency signal;
   e) a first mixer in said second signal path for combining the received radio frequency signal on said second signal path with said first injection signal to produce a first intermediate frequency signal; and
   f) a back end including a second mixer for mixing the first intermediate frequency signal with said second injection signal to produce a second intermediate frequency signal.

24. The dual-band receiver of claim 23 wherein said first radio frequency band is a cellular band and said second radio frequency band is a pager band.

25. The dual-band receiver of claim 23 further including first and second preselector filters disposed along said first and second signal paths, respectively, for filtering the received signal prior to mixing.

26. The dual-band receiver of claim 25 further including first and second low-noise amplifiers disposed along said first and second signal paths, respectively, between said preselector filters and said first mixers for amplifying said received radio frequency signal.

27. The dual-band receiver of claim 25 further including a common low-noise amplifier connected to both said first and second signal paths between said preselector filters and said first mixers for amplifying said received radio frequency signal.

28. The dual-band receiver of claim 23 further including a first intermediate frequency filter connected to the output of said front end for filtering said first intermediate frequency signal.

29. The dual-band receiver of claim 23 further including two second intermediate frequency filters for filtering said second intermediate frequency signal, wherein a first one of said second intermediate frequency filters is used to filter radio frequency signals received in said first radio frequency band, and wherein the second one of said second intermediate frequency filters is used to filter radio frequency signals received in said second radio frequency band.

30. The dual-band receiver of claim 29 wherein at least one of said second intermediate frequency filters is an active filter.

31. The dual-band receiver of claim 29 wherein at least one of said second intermediate frequency filters is a ceramic filter.

32. The dual-band receiver of claim 23 further including a common frequency reference for said first and second frequency synthesizers.

33. The dual-band receiver of claim 32 wherein said frequency reference is an integer multiple of 150 kHz.

34. The dual-band receiver of claim 23 further including means for selectively powering said first and second signal paths in said front end so that only one signal path is active at a time.

* * * * *